(12) United States Patent  
Shinozaki et al.

(10) Patent No.: US 12,330,244 B2
(45) Date of Patent: Jun. 17, 2025

(54) FLUX, SOLDER PASTE, AND METHOD FOR PRODUCING BONDED BODY

(71) Applicant: SENJU METAL INDUSTRY CO., LTD., Tokyo (JP)

(72) Inventors: Keisuke Shinozaki, Tokyo (JP); Kazuya Kitazawa, Tokyo (JP); Hiroaki Kawamata, Tokyo (JP); Yuki Fujino, Tokyo (JP)

(73) Assignee: Senju Metal Industry Co., Ltd., Tokyo (JP)

(*) Notice: Subject to any disclaimer, the term of this patent is extended or adjusted under 35 U.S.C. 154(b) by 0 days.

(21) Appl. No.: 18/880,717

(22) PCT Filed: Jul. 21, 2023

(86) PCT No.: PCT/JP2023/026807
§ 371 (c)(1),
(2) Date: Jan. 2, 2025

(87) PCT Pub. No.: WO2024/024676
PCT Pub. Date: Feb. 1, 2024

(65) Prior Publication Data
US 2025/0170679 A1 May 29, 2025

(30) Foreign Application Priority Data
Jul. 25, 2022 (JP) .................. 2022-118197

(51) Int. Cl.
*B23K 35/36* (2006.01)
*B23K 35/02* (2006.01)

(52) U.S. Cl.
CPC ........ *B23K 35/3613* (2013.01); *B23K 35/025* (2013.01); *B23K 35/3618* (2013.01)

(58) Field of Classification Search
CPC .............. B23K 35/3613; B23K 35/025; B23K 35/3618
See application file for complete search history.

(56) References Cited

U.S. PATENT DOCUMENTS

2004/0000355 A1  1/2004  Suga et al.
2020/0361039 A1  11/2020 Kawanago et al.
(Continued)

FOREIGN PATENT DOCUMENTS

CN    109877484 A  *  6/2019  ............. B23K 35/02
CN    111989188 A     11/2020
(Continued)

OTHER PUBLICATIONS

CN-109877484-A; Espacenet English machine translation (Year: 2019).*
(Continued)

*Primary Examiner* — Adil A. Siddiqui
(74) *Attorney, Agent, or Firm* — Nixon Peabody LLP; Jeffrey L. Costellia

(57) ABSTRACT

This flux contains a first solvent and a thixotropic agent. The first solvent either has a viscosity of 10 Pa·s or more at 30° C. or is a solid at 30° C., has a boiling point of 200° C. or more, and has a weight loss rate of less than 96 mass % when heated to 230° C. The thixotropic agent contains a polyamide that is one or more substances selected from the group consisting of condensates of an aliphatic carboxylic acid and an amine and condensates of an aliphatic carboxylic acid, a hydroxy group-containing aliphatic carboxylic acid, and an amine. The content of the first solvent is 30 mass % or more with respect to the total mass of flux. The content of the polyamide exceeds 2 mass % with respect to the total mass of flux.

6 Claims, 2 Drawing Sheets

(56) References Cited

U.S. PATENT DOCUMENTS

2021/0213570 A1\* 7/2021 Kawano ............... B23K 35/025
2021/0299799 A1\* 9/2021 Kawamata ........... B23K 35/025
2022/0009042 A1  1/2022 Yukikata et al.

FOREIGN PATENT DOCUMENTS

| EP | 4230342 A1 | 8/2023 |
|---|---|---|
| JP | 2004025305 A | 1/2004 |
| JP | 2006289497 A | 10/2006 |
| JP | 2009542019 A | 11/2009 |
| JP | 2015160244 A | 9/2015 |
| JP | 2019122994 A | 7/2019 |
| JP | 2022080827 A | 5/2022 |
| TW | 200503872 A | 2/2005 |
| TW | 202140183 A | 2/2005 |
| TW | 202227557 A | 7/2022 |
| WO | 2008000349 A1 | 1/2008 |
| WO | 2017065076 A1 | 4/2017 |

OTHER PUBLICATIONS

International Search Report for Application No. PCT/JP2023/026807, mail Oct. 17, 2023, (4 pages).
Taiwan Office Action for Application No. 112127187, mail May 23, 2024, (13 pages).
Office Action for Chinese Application 202380050211.3, mailed Mar. 29, 2025, (7 pages).

\* cited by examiner

FLUX, SOLDER PASTE, AND METHOD FOR PRODUCING BONDED BODY

TECHNICAL FIELD

The present invention relates to a flux, solder paste, and method for producing a bonded body Priority is claimed on Japanese Patent Application No. 2022-118197, filed Jul. 25, 2022, the content of which is incorporated herein by reference.

BACKGROUND ART

Fixing of parts to a substrate and electrical connection of parts to a substrate are generally carried out by soldering. A flux, a solder powder, and a solder paste that is a mixture of a flux and a solder powder are used to carry out soldering.

A flux has an efficacy of chemically removing metal oxides that are present on both a metal surface of an object to be soldered and a solder, thereby allowing the movement of metal elements at the boundaries of both. Therefore, soldering using a flux allows intermetallic compounds to be formed therebetween, thereby forming a firm bond.

In a case where soldering is conducted using a solder paste, the solder paste is printed on a substrate, and then a part is mounted thereon, followed by heating the substrate on which the part is mounted in a heating furnace called a reflow furnace. Thus, a solder powder contained in the solder paste is melted to allow the part to be soldered to the substrate.

The flux used to carry out reflow soldering generally contains a resin component, a solvent, an active agent, a thixotropic agent, and the like. A rosin is added to the flux as the resin component in order to make the rheological properties such as viscosity of the flux and thixotropic ratio appropriate. The rosin remains as a flux residue after reflow.

On the other hand, Patent Document 1 proposes a solder paste, which reduces the flux residue due to the absence of any rosins.

CITATION LIST

Patent Document

Patent Document 1: Japanese Unexamined Patent Application, First Publication No. 2006-289497

SUMMARY OF INVENTION

Technical Problem

However, it is difficult to suppress heating sagging by the solder paste using the flux described in Patent Document 1.

Therefore, an object of the present invention is to provide a flux which can reduce flux residue and suppress heating sagging, a solder paste, and a method for producing a bonded body.

Solution to Problem

The present invention encompasses the following aspects.

[1] A flux containing a first solvent and a thixotropic agent, wherein the first solvent either has a viscosity of 10 Pa·s or more at 30° C. or is a solid at 30° C., the boiling point of the first solvent is 200° C. or more, the weight loss rate of the first solvent is less than 96% by mass when heated to 230° C., the thixotropic agent contains at least one polyamide selected from the group consisting of condensates of aliphatic carboxylic acids and amines and condensates of aliphatic carboxylic acids, hydroxy group-containing aliphatic carboxylic acids and amines, the amount of the first solvent relative to the total mass (100% by mass) of the flux is 30% by mass or more, the amount of the polyamide relative to the total mass (100% by mass) of the flux exceeds 2% by mass.

[2] The flux according to [1], further containing a second solvent (excluding the solvent corresponding to the first solvent), wherein the second solvent has a boiling point of 250° C. or more and a relative permittivity of 6.0 or more.

[3] The flux according to [2], wherein the second solvent is a compound of the following general formula (1).

[Chemical formula 1]

[In the formula, $R^1$ is a hydrocarbon group having two to four carbon atoms, $R^2$ is a hydrocarbon group having four to ten carbon atoms, and m is 1 to 3.]

[4] The flux according to [2] or [3], wherein the mass ratio of the second solvent to the first solvent, indicated as the mass ratio of second solvent/first solvent, is 0.1 to 1.0.

[5] The flux according to any one of [2] to [4], wherein the mass ratio of the polyamide to the second solvent, indicated as the mass ratio of polyamide/second solvent, is 0.15 to 0.4.

[6] The flux according to any one of [1] to [5], wherein the aliphatic carboxylic acids contain dicarboxylic acids.

[7] A solder paste containing a solder alloy powder and the flux of any one of [1] to [6].

[8] A method for producing a bonded body, including a step in which a part and a substrate are soldered to obtain a bonded body, wherein
reflow is carried out using the solder paste of [7] under reducible gas atmosphere during soldering.

Advantageous Effects of Invention

The present invention makes it possible to provide a flux which can reduce flux residue and suppress heating sagging, a solder paste and a method for producing a bonded body.

DESCRIPTION OF EMBODIMENTS (Flux)

Figure 1:
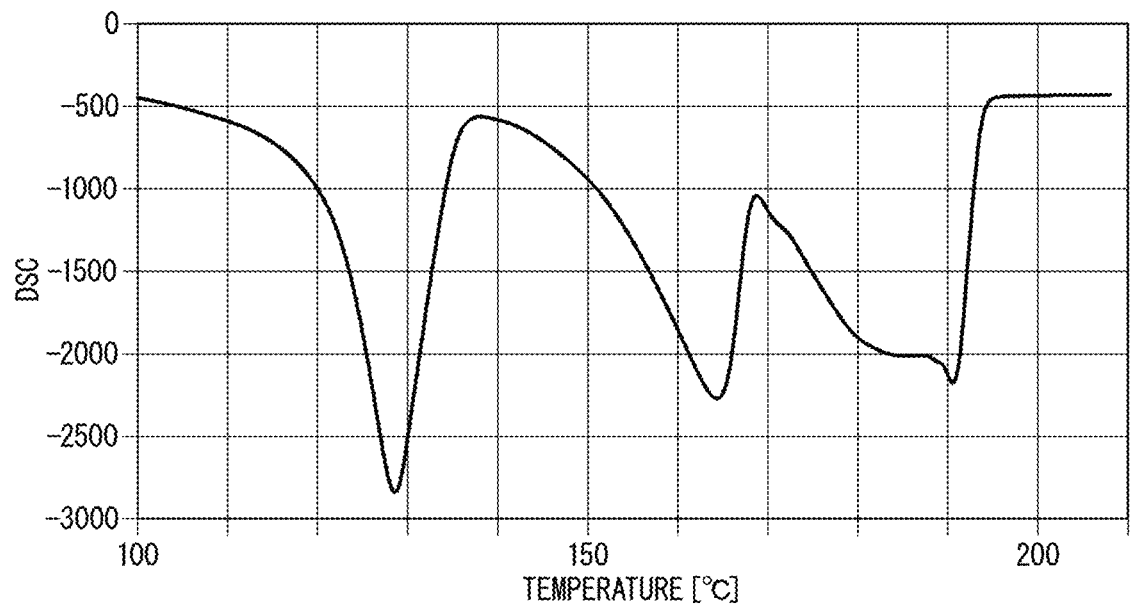
FIG. 1 A graph showing a DSC curve of a polyamide contained in a flux according to one embodiment of the present invention.

A flux according to the present embodiment contains: a first solvent; and a thixotropic agent containing a particular polyamide. The flux according to the present embodiment is preferably used in reflow soldering.

The flux according to the present embodiment makes it easy to impart predetermined rheological properties while reducing flux residue by containing the first solvent and the particular polyamide.

The reflow soldering includes the following steps. A substrate on which a part is mounted is heated at 150° C. to 180° C. for one minute to two minutes (this step being referred to as "preheating"). Next, the resultant is heated for about one minute at a temperature between the liquidus temperature of a solder alloy and a temperature higher by about 20° C. than the liquidus temperature (this temperature being referred to as "peak temperature") (this step being referred to as "main heating").

Since it is difficult to volatilize the flux according to the present embodiment during preheating, the first solvent tends to remain after preheating and before main heating. Thus, it becomes easier to prevent a thixotropic agent, an active agent or the like from drying out, thereby becoming a flux residue. Since it is difficult to volatilize the flux according to the present embodiment during preheating, volatilization of an active agent or the like tends to be suppressed. As a result, effects of the active agent or the like tends to be maintained. Namely, the heat resistance of the flux tends to be improved.

In addition, the first solvent of the flux according to the present embodiment tends to volatilize at a temperature around the peak temperature during main heating of reflow. Thus, the amount of the solvent remaining after reflow is reduced, and therefore the flux residue is easily reduced.

In addition, the flux according to the present embodiment easily suppresses heating sagging by containing the particular polyamide. Since the particular polyamide easily improves the heating sagging-suppressibility, an addition amount thereof required to exhibit a predetermined heating sagging-suppressibility can be reduced. As a result, the flux residue can be reduced.

<Solvent>
<<First Solvent>>

The first solvent either has a viscosity of 10 Pa·s or more at 30° C. or is a solid at 30° C. The boiling point of the first solvent is 200° C. or more. The weight loss rate of the first solvent when heated to 230° C. is less than 96% by mass. The amount of the first solvent relative to the total mass (100% by mass) of the flux is 30% by mass or more.

The first solvent either has a viscosity of 10 Pa·s or more at 30° C. or is a solid at 30° C. The viscosity of the first solvent at 30° C. may be 10 Pa·s or more and 5000 Pa·s or less, 10 Pa·s or more and 2000 Pa·s or less, or 10 Pa·s or more and 1000 Pa·s or less.

Thus, it becomes easy to impart predetermined rheological properties to the flux according to the present embodiment, even if no rosin is contained in the flux.

The viscosity is measured with a Brookfield-type viscometer.

In the present specification, the expression "is a solid at 30° C." means having a melting point exceeding 30° C.

In the present specification, the term "melting point" means the temperature at which a solid melts to become a liquid. The values of the melting points of compounds in the present specification are mainly the values described in "Kagaku Binran, Basic Edition, Revised 5th Edition".

The boiling point of the first solvent is 200° C. or more, preferably 250° C. or more, more preferably 280° C. or more, and even more preferably 300° C. or more.

When the boiling point of the first solvent is the above-mentioned lower limit or more, the first solvent tends to remain after preheating and before main heating. Accordingly, effects of a thixotropic agent, an active agent and the like tends to be maintained. As a result, it becomes easy to improve the heat resistance of the flux and to prevent a thixotropic agent, an active agent, and the like from solidifying to form flux residue after preheating and before main heating.

The boiling point of the first solvent is preferably 450° C. or less, more preferably 410° C. or less, even more preferably 370° C. or less, and particularly preferably 330° C. or less.

When the boiling point of the first solvent is the upper limit or less, the flux easily volatilizes during main heating. Thus, the flux residue is easily reduced after main heating.

The boiling point of the first solvent is preferably 200° C. or more and 450° C. or less, more preferably 250° C. or more and 410° C. or less, even more preferably 280° C. or more and 370° C. or less, and even more preferably 300° C. or more and 370° C. or less.

In the present specification, the term "boiling point" means the temperature of a target liquid at which the saturated vapor pressure of the target liquid is equal to one atmosphere (namely, 1013 hPa).

The weight loss rate of the first solvent when heated to 230° C. is less than 96% by mass, preferably less than 93% by mass, more preferably less than 90% by mass, even more preferably less than 87% by mass, and particularly preferably less than 84% by mass.

When the weight loss rate is within the above-mentioned range, the first solvent tends to remain after preheating and before main heating. Accordingly, effects of an active agent or the like tend to be maintained. As a result, it becomes easy to improve the heat resistance of the flux and to prevent a thixotropic agent, an active agent, and the like from solidifying to form flux residue after preheating and before main heating.

The lower limit of the weight loss rate of the first solvent when hated to 230° C. is not particularly limited, as long as effects of the present invention are exhibited, and the lower limit may be 50% by mass, for example.

The weight loss rate of the first solvent when hated to 230° C. is 50% by mass or more and less than 96% by mass, preferably 60% by mass or more and less than 93% by mass, more preferably 65% by mass or more and less than 90% by mass, even more preferably 70% by mass or more and less than 87% by mass, and particularly preferably 75% by mass or more and less than 84% by mass. Alternatively, the weight loss rate of the first solvent when hated to 230° C. is preferably 81% by mass or more and 94% by mass or less.

In the present invention, the "weight loss rate when heated to a particular temperature" is measured as follows, for example.

10 mg of a target sample to be measured is placed in an aluminum pan, and heated such that the temperature thereof is increased to a specific temperature at a rate of 10° C./min with a differential thermal/thermogravimetric simultaneous analyzer (manufactured by Hitachi High-Tech Science Corporation, STA7200). Then, the weight loss rate is calculated from the mass $W_0$ of the target sample before heating and the mass $W_1$ of the target sample when the temperature of the target sample reaches a specific temperature in accordance with the following equation.

$$\text{Weight loss rate (\% by mass)}=100\times(W_0-W_1)/W_0$$

The weight loss rate of the first solvent when heated to 250° C. is preferably 95% by mass or more, more preferably 97% by mass or more, even more preferably 98% by mass or more, and particularly preferably 99% by mass or more.

When the weight loss rate of the first solvent when heated to 250° C. is within the above-mentioned range, the flux easily volatilizes during reflow. Thus, the flux residue tends to be further reduced after reflow.

The upper limit of the weight loss rate of the first solvent when heated to 250° C. is not particularly limited, as long as effects of the present invention are exhibited, and the upper limit may be 100% by mass in terms of measurement.

The upper limit of the weight loss rate of the first solvent when heated to 250° C. is preferably 95% by mass or more and 100% by mass or less, more preferably 97% by mass or more and 100% by mass or less, even more preferably 98% by mass or more and 100% by mass or less, and particularly preferably 99% by mass or more and 100% by mass or less.

One type of the first solvent may be used alone or at least two types thereof may be used in combination.

Examples of the first solvent include isobornyl cyclohexanol, and trimethylolpropane, and isobornyl cyclohexanol is preferable.

The amount of the first solvent relative to the total mass (100% by mass) of the flux is 30% by mass or more, preferably 40% by mass or more, more preferably 50% by mass or more, even more preferably 60% by mass or more, and particularly preferably 70% by mass or more.

The amount of the first solvent relative to the total mass (100% by mass) of the flux is preferably 95% by mass or less, preferably 90% by mass or less, more preferably 85% by mass or less, and particularly preferably 80% by mass or less.

The amount of the first solvent relative to the total mass (100% by mass) of the flux is 30% by mass or more and 98% by mass or less, preferably 40% by mass or more and 95% by mass or less, more preferably 50% by mass or more and 90% by mass or less, even more preferably 60% by mass or more and 85% by mass or less, and particularly preferably 70% by mass or more and 80% by mass or less. The amount of the first solvent relative to the total mass (100% by mass) of the flux is preferably 30% by mass or more and 86% by mass or less, and more preferably 40% by mass or more and 86% by mass or less.

<<Other Solvents>>

The flux according to the present embodiment may further contain other solvents in addition to the first solvent.

Examples of the other solvents include glycol ether-based solvents, alcohol-based solvents, terpineols, and ester-based solvent.

One type of other solvents may be used alone, or at least two types thereof may be mixed and used.

Examples of other solvents include the following compounds. The value in parentheses means the boiling point of the solvent.

Examples of the glycol ether-based solvents include ethylene glycol monophenyl ether (237° C.), diethylene glycol monobutyl ether (230.6° C.), propylene glycol monophenyl ether (242° C.), tripropylene glycol monomethyl ether (243° C.), diethylene glycol monohexyl ether (259° C.), diethylene glycol mono-2-ethylhexyl ether (275° C.), diethylene glycol dibutyl ether (256° C.), triethylene glycol monobutyl ether (278° C.), triethylene glycol butylmethyl ether (261° C.), tetraethylene glycol dimethyl ether (275° C.), and tri (propylene glycol) n-butyl ether.

Examples of the alcohol-based solvents include 1,2-butanediol (192° C.), 2-methyl-2,4-pentanediol (197° C.), 2,3-dimethyl-2,3-butanediol (174° C.), 1-ethynyl-1-cyclohexanol (180° C.), 2,4-diethyl-1,5-pentanediol (338° C.), and 1,2,6-trihydroxyhexane.

Examples of the terpineols include α-terpineol (218° C.), β-terpineol (210° C.), γ-terpineol (218° C.), and terpineol mixture (namely, mixtures containing α-terpineol as the main component thereof with β-terpineol or γ-terpineol).

Examples of the ester-based solvents include bis(2-ethylhexyl) sebacate.

(Second Solvent)

The flux according to the present embodiment may further contain a second solvent in addition to the first solvent.

The boiling point of the second solvent is 250° C. or more and the relative permittivity thereof is 6.0 or more.

The boiling point of the second solvent is preferably 250° C. or more and 350° C. or less, and more preferably 250° C. or more and 300° C. or less.

The relative permittivity of the second solvent is preferably 6.0 or more and 50 or less, more preferably 6.0 or more and 30 or less, even more preferably 6.0 or more and 20 or less, even more preferably 6.0 or more and 15 or less, and particularly preferably 6.0 or more and 9.0 or less.

The relative permittivity is measured in accordance with JIS C 2565 (1992) at a measurement frequency of 1 GHz. Specifically, a sample is mounted on a transmission-type circular $TM_{010}$ resonator along the axis of the resonator at the center of the resonator, followed by measuring the resonance frequency $f_1$ by applying an external magnetic field in the axial direction of the sample until no change in measured value is observed even when the magnetic field is changed. The frequency $f_0$ is measured by a similar procedure thereto, except that the sample is not mounted on the resonator. Furthermore, the parameter C is calculated using an electromagnetic field analysis software SIMULIA CST Studio Suite (Dassault Systemes Simulia Corporation), and the relative permittivity $\varepsilon_r$ is calculated according to the following equation.

$$\varepsilon_r = 1 + \frac{2}{C}\left(\frac{f_0 - f_1}{f_0}\right) \quad \text{[Equation 1]}$$

Since the flux according to the present embodiment contains both the first solvent and the second solvent, volatilization of a solder paste printed on a substrate is suppressed during storage. As a result, the decrease in the tacking of the solder paste containing the flux tends to be suppressed, and the mountability of parts on the substrate on which the solder paste containing the flux is printed tends to be improved.

The second solvent is preferably a compound of the following general formula (1).

[Chemical formula 2]

(1)

In the formula (1), $R^1$ is a hydrocarbon group having two to four carbon atoms. $R^2$ is a hydrocarbon group having four to ten carbon atoms. m is 1 to 3.

The hydrocarbon group as $R^1$ may be an aliphatic hydrocarbon group. The aliphatic hydrocarbon group may be saturated or unsaturated, and is preferably saturated.

Examples of the aliphatic hydrocarbon group include linear or branched aliphatic hydrocarbon groups, and aliphatic hydrocarbon groups having a ring in the structure thereof, and the aliphatic hydrocarbon group is preferably a linear aliphatic hydrocarbon group.

The carbon number of the linear or branched aliphatic hydrocarbon group is preferably two to three, and more preferably two.

The linear aliphatic hydrocarbon group as $R^1$ is preferably a linear alkylene group, specific examples thereof include a methylene group [—$CH_2$—], an ethylene group [—$(CH_2)_2$—], a trimethylene group [—$(CH_2)_3$—], and a tetramethylene group [—$(CH_2)_4$—], and an ethylene group [—$(CH_2)_2$—] is preferable.

The branched aliphatic hydrocarbon group as $R^1$ is preferably a branched alkylene group, specific examples thereof include alkylmethylene groups such as —$CH(CH_3)$—, —$CH_2$—$CH(CH_3)$—, —$CH(CH_2CH_3)$—, —$C(CH_3)_2$—, and —$C(CH_3)(CH_2CH_3)$—; alkylethylene groups such as —$CH(CH_3)CH_2$—, —$CH(CH_3)CH(CH_3)$—, —$C(CH_3)_2CH_2$—, and —$CH(CH_2CH_3)CH_2$—; and alkyltrimethylene groups such as —$CH(CH_3)CH_2CH_2$—, and —$CH_2CH(CH_3)CH_2$—, and —$CH_2$—$CH(CH_3)$— is preferable.

The hydrocarbon group as $R^2$ may be an aliphatic hydrocarbon group. The aliphatic hydrocarbon group may be saturated or unsaturated, and is preferably saturated.

Specific examples of the aliphatic hydrocarbon group include linear or branched aliphatic hydrocarbon groups and aliphatic hydrocarbon groups having a ring in the structure thereof.

The carbon number of the hydrocarbon group as $R^2$ is preferably four to eight, more preferably five to seven, and most preferably six.

As the compound of the general formula (1), a diethylene glycol monohexyl ether is preferable.

The diethylene glycol monohexyl ether is of the general formula (1), in which $R^1$ is an ethylene group. $R^2$ is a linear hexyl group, and m is 2.

The amount of the second solvent relative to the total mass (100% by mass) of the flux is preferably 60% by mass or less, more preferably 50% by mass or less, even more preferably 40% by mass or less, particularly preferably 30% by mass or less, and most preferably 25% by mass or less.

When the amount of the second solvent is the upper limit or less, the heating sagging-suppressibility tends to be improved, and the solder ball generation-suppressibility also tends to be improved.

The amount of the second solvent relative to the total mass (100% by mass) of the flux is preferably 5% by mass or more, and more preferably 10% by mass or more.

When the amount of the second solvent is the above-mentioned lower limit or more, the tacking of the solder paste containing the flux tends to be enhanced, and the mountability of parts on the substrate on which the solder paste containing the flux is printed tends to be improved.

The amount of the second solvent relative to the total mass (100% by mass) of the flux is preferably 5% by mass or more and 60% by mass or less, more preferably 5% by mass or more and 50% by mass or less, even more preferably 10% by mass or more and 46% by mass or less, even more preferably 10% by mass or more and 40% by mass or less, particularly preferably 10% by mass or more and 30% by mass or less, and most preferably 10% by mass or more and 25% by mass or less.

In the flux, the mass ratio of the first solvent and the second solvent, indicated by the mass ratio of second solvent/first solvent, namely the ratio of the total mass of the second solvent to the total mass of the first solvent, is preferably 0.1 to 1.0.

When the mass ratio of the second solvent/first solvent is within the above-mentioned range, the tacking of the flux tends to be enhanced, and the mountability of parts on the substrate on which the solder paste containing the flux is printed tends to be improved.

The total amount of the first solvent and the second solvent in the total solvents in the flux according to the present embodiment, relative to the total mass (100% by mass) of the total solvents, is preferably 65% by mass or more and 100% by mass or less, more preferably 75% by mass or more and 100% by mass or less, even more preferably 85% by mass or more and 100% by mass or less, and even more preferably 100% by mass.

When the total amount of the first solvent and the second solvent in total solvents in the flux is within the above-mentioned range, the tacking of the flux tends to be enhanced, and the mountability of parts on the substrate on which the solder paste containing the flux is printed tends to be improved.

<Thixotropic Agent>

The flux according to the present embodiment contains a thixotropic agent containing a particular polyamide.

<<Polyamide>>

In the present specification, the term "particular polyamide" means an amide having at least three amid bonds in the molecule thereof.

The amount of a particular polyamide relative to the total mass (100% by mass) of the flux exceeds 2% by mass.

The particular polyamide is at least one type selected from the group consisting of "condensates of aliphatic carboxylic acids and amines" and "condensates of hydroxy group-containing aliphatic carboxylic acids, aliphatic carboxylic acids and amines", and the "condensates of hydroxy group-containing aliphatic carboxylic acids, aliphatic carboxylic acids and amines" are preferable.

One type of the aliphatic carboxylic acid causing the particular polyamide may be used alone or at least two types thereof may be mixed and used.

Examples of the aliphatic carboxylic acid include monocarboxylic acids, dicarboxylic acids, and tricarboxylic acids. The aliphatic carboxylic acid is preferably a monocarboxylic acid or a dicarboxylic acid, and more preferably a dicarboxylic acid.

A hydrocarbon group of the aliphatic carboxylic acid may be linear, branched or cyclic. The hydrocarbon group is preferably linear or branched, and more preferably linear.

The hydrocarbon group may be a saturated hydrocarbon group or an unsaturated hydrocarbon group. The hydrocarbon group is preferably a saturated hydrocarbon group.

The carbon number of the aliphatic monocarboxylic acid is preferably 12 to 22, more preferably 14 to 22, and even more preferably 16 to 22.

Examples of the aliphatic monocarboxylic acid include lauric acid, myristic acid, pentadecylic acid, palmitic acid, margaric acid, stearic acid, nonadecanoic acid, arachidic acid, and behenic acid. The aliphatic monocarboxylic acid is preferably palmitic acid or stearic acid.

The carbon number of the aliphatic dicarboxylic acid is preferably 2 to 20, more preferably 6 to 16, and even more preferably 8 to 14.

Examples of the aliphatic dicarboxylic acids include adipic acid, pimelic acid, suberic acid, azelaic acid, sebacic acid, undecanedioic acid, dodecanedioic acid, tridecanedioic acid, tetradecanedioic acid, and pentadecanedioic acid. The aliphatic dicarboxylic acid is preferably suberic acid, azelaic acid, sebacic acid, undecanedioic acid or dodecanedioic acid, more preferably sebacic acid or dodecanedioic acid, and even more preferably dodecanedioic acid.

The aliphatic carboxylic acid preferably contains an aliphatic dicarboxylic acid. The aliphatic carboxylic acid may contain: at least one type selected from the group consisting of sebacic acid and dodecanedioic acid; and at least one type selected from the group consisting of palmitic acid and stearic acid.

One type of the hydroxy group-containing aliphatic carboxylic acid which causes the particular polyamide may be used alone or at least two types thereof may be used.

A hydrocarbon group in the hydroxy group-containing aliphatic carboxylic acid may be linear, branched or cyclic. The hydrocarbon group is preferably linear or branched, and more preferably linear.

The hydrocarbon group may be a saturated hydrocarbon group, or an unsaturated hydrocarbon group. The hydrocarbon group is preferably a saturated hydrocarbon group.

The carbon number of the hydroxy group-containing aliphatic carboxylic acid is preferably 10 to 25, and more preferably 15 to 21.

Examples of the hydroxy group-containing aliphatic carboxylic acid include hydroxypentadecanoic acid, hydroxyhexadecanoic acid, hydroxyheptadecanoic acid, hydroxyoctadecanoic acid (hydroxystearic acid), hydroxyeicosanoic acid, and hydroxyheneicosanoic acid. The hydroxy group-containing aliphatic carboxylic acid is preferably hydroxystearic acid, and more preferably 12-hydroxystearic acid.

One type of the amine which causes the particular polyamide may be used alone or at least two types thereof may be used in combination.

Examples of the amine include aliphatic amines and aromatic amines. The amine is preferably an aliphatic amine.

Examples of the amine include monoamines, diamines, triamines, and tetraamines. The amine is preferably a diamine.

A hydrocarbon group of the aliphatic amine may be linear, branched or cyclic. The hydrocarbon group is preferably linear or branched, and more preferably linear. The carbon number of the aliphatic amine is preferably 3 to 10, and more preferably 4 to 8.

The hydrocarbon group may be a saturated hydrocarbon group or an unsaturated hydrocarbon group. The hydrocarbon group is preferably a saturated hydrocarbon group.

Examples of the amine include ethylenediamine, 1,3-propanediamine, 1,4-butanediamine, hexamethylenediamine, meta-xylenediamine, tolylenediamine, para-xylenediamine, phenylenediamine, isophoronediamine, 1,10-decanediamine, 1,12-dodecanediamine, 4,4'-diaminodicyclohexylmethane, 4,4'-diaminodiphenylmethane, butane-1,1,4,4-tetraamine, and pyrimidine-2,4,5,6-tetraamine. The amine is preferably hexamethylenediamine.

The temperature of the endothermic peak of the particular polyamide can be measured by DSC (Differential Scanning calorimetry).

In the specific method for measuring the endothermic peak, the endothermic peak is measured by heating about 10 mg of polyamide from 25° C. to 350° C. under a nitrogen atmosphere at a heating rate of 20° C./min. As the measuring device, DSC7020 (manufactured by Hitachi High-Tech Science Corporation) can be used. In the present specification, the temperature of an endothermic peak means the temperature at the top of the peak.

The particular polyamide used in the flux according to the present embodiment has one or more endothermic peaks within a temperature range of 120° C. to 200° C.

When the number of the endothermic peak is one, the temperature of the endothermic peak is preferably 150° C. or more and 200° C. or less, more preferably 160° C. or more and 200° C. or less, even more preferably 170° C. or more and 200° C. or less, and particularly preferably 180° C. or more and 200° C. or less.

When the number of the endothermic peak is two or more, the lowest temperature of endothermic peaks of the particular polyamide may be 120° C. or more and 200° C. or less, the highest temperature of endothermic peaks of the particular polyamide may be 120° C. or more and 200° C. or less, or all endothermic peaks of the particular polyamide may fall within a range of 120° C. to 200° C.

The highest temperature of endothermic peaks is preferably 150° C. or more and 200° C. or less, more preferably 160° C. or more and 200° C. or less, even more preferably 170° C. or more and 200° C. or less, and particularly preferably 180° C. or more and 200° C. or less.

The ratio of the endothermic energy amount of the particular polyamide measured by DSC within a range of 160° C. to 200° C. relative to the total endothermic energy amount within a range of 50° C. to 200° C. is preferably 30% or more, more preferably 40% or more, and even more preferably 45% or more.

When the ratio of the endothermic energy amount of the particular polyamide measured by DSC within a range of 160° C. to 200° C. is the above-mentioned lower limit or more, heating sagging during reflow can be sufficiently suppressed. Particularly, even when the temperature of preheating is enhanced, for example, to 190° C. or more, or 200° C. or more, heating sagging can be suppressed.

In the present specification, the endothermic energy amount of the particular polyamide can be calculated from a peak area of a DSC curve of the particular polyamide.

The ratio of the endothermic energy amount of the particular polyamide measured by DSC within a range of 50° C. to 150° C. relative to the total endothermic energy amount within a range of 50° C. to 200° C. is preferably 80% or less, more preferably 60% or less, and even more preferably 50% or less.

Although the lower limit of the ratio of the endothermic energy amount is not particularly limited, as long as effects of the present invention are exhibited, the lower limit may be 10% or more, 20% or more or 30% or more, for example.

The ratio of the endothermic energy amount is preferably 10% or more and 80% or less, more preferably 10% or more and 60% or less, and even more preferably 10% or more and 50% or less. Alternatively, the ratio of the endothermic energy amount is preferably 20% or more and 80% or less, more preferably 20% or more and 60% or less, and even more preferably 30% or more and 50% or less.

The ratio of the endothermic energy amount of the particular polyamide measured by DSC within a range of 50° C. to 180° C. relative to the total endothermic energy amount within a range of 50° C. to 200° C. is preferably 95% or less, more preferably 90% or less, and even more preferably 85% or less.

Although the lower limit of the ratio of the endothermic energy amount is not particularly limited, as long as effects of the present invention are exhibited, the lower limit may be 40% or more, 50% or more, or 60% or more, for example.

The ratio of the endothermic energy amount is preferably 40% or more and 95% or less, more preferably 40% or more and 90% or less, and even more preferably 40% or more and 85% or less. Alternatively, the ratio of the endothermic energy amount is preferably 50% or more and 95% or less, more preferably 50% or more and 90% or less, and even more preferably 60% or more and 85% or less.

The particular polyamide contained in the flux according to the present embodiment is preferably a condensate of an aliphatic carboxylic acid, a hydroxy group-containing aliphatic monocarboxylic acid and an amine, from the viewpoint that the heating sagging-suppressibility can be further improved.

The particular polyamide contained in the flux according to the present embodiment is more preferably a condensate of an aliphatic dicarboxylic acid, a hydroxy group-containing aliphatic monocarboxylic acid, and a diamine.

The particular polyamide contained in the flux according to the present embodiment is more preferably a condensate of an aliphatic dicarboxylic acid having 8 to 14 carbon atoms, a hydroxy group-containing aliphatic monocarboxylic acid having 15 to 21 carbon atoms, and an aliphatic diamine having 4 to 8 carbon atoms.

Among them, the particular polyamide is particularly preferably a condensate of at least one type selected from the group consisting of sebacic acid and dodecanedioic acid, a 12-hydroxystearic acid, and a hexamethylenediamine.

The particular polyamide may be a condensate of at least one type selected from the group consisting of sebacic acid and dodecanedioic acid, at least one type selected from the group consisting of palmitic acid and stearic acid, a 12-hydroxystearic acid, and a hexamethylenediamine.

When the particular polyamide is a condensate of an aliphatic dicarboxylic acid, a hydroxy group-containing aliphatic monocarboxylic acid, and an aliphatic diamine, the molar ratios of these raw materials preferably satisfy the following relational expression.

In the relational expression, X is mol of an aliphatic dicarboxylic acid used as a raw material of a particular polyamide, Y is mol of a hydroxy group-containing aliphatic monocarboxylic acid, and Z is mol of an aliphatic diamine.

The total mol of amino groups of compounds contained in raw materials is preferably equal to or lower than the total mol of carboxy groups thereof. Specifically, the relational expression: $2Z \leq 2X+Y$ is preferably satisfied.

The molar relationship among the raw materials preferably satisfies $0.2Y \leq X \leq 2Y$, and more preferably satisfies $0.4Y \leq X \leq 1.5Y$.

The molar relationship among the raw materials preferably satisfies $0.5Y \leq Z \leq 2Y$, and more preferably satisfies $0.8Y \leq Z \leq 1.8Y$.

In the flux, the amount of the particular polyamide relative to the total mass (100% by mass) of the flux exceeds 2% by mass, more preferably 3% by mass or more, even more preferably 4% by mass or more, and particularly preferably 5% by mass or more.

The heating sagging-suppressibility is easily improved and the solder ball generation-suppressibility is also easily improved by making the amount of the particular polyamide be the above-mentioned lower limit or more.

In the flux, the upper limit of the amount of the particular polyamide is not particularly limited, as long as effects of the present invention are exhibited, and the amount of the particular polyamide relative to the total mass (100% by mass) of the flux may be 15% by mass or less, and is preferably 10% by mass or less, more preferably 8% by mass or less, and even more preferably 7% by mass or less.

When the amount of the particular polyamide is the upper limit or less, the flux residue tends to be further reduced.

In the flux, the amount of the particular polyamide relative to the total mass (100% by mass) of the flux is more than 2% by mass and 15% by mass or less, more preferably 3% by mass or more and 10% by mass or less, even more preferably 4% by mass or more and 8% by mass or less, and particularly preferably 4% by mass or more and 5% by mass or less.

In the flux, the mass ratio of the particular polyamide and the second solvent, the mass ratio of particular polyamide/second solvent, namely the ratio of the total mass of the particular polyamide to the total mass of the second solvent, is preferably 0.08 to 0.4, and more preferably 0.15 to 0.4.

When the mass ratio of particular polyamide/second solvent is within the above-mentioned range, the heating sagging-suppressibility tends to be enhanced, and the solder ball generation-suppressibility also tends to be improved.

<<Other Thixotropic Agents>>

The thixotropic agent may further contain other thixotropic agents in addition to the polyamide.

Examples of other thixotropic agents include: amide-based thixotropic agent other than ones mentioned above; wax-based thixotropic agents, and sorbitol-based thixotropic agents.

One type of other thixotropic agents may be used alone or at least two types thereof may be mixed and used.

Examples of the amide-based thixotropic agents other than ones mentioned above include monoamides, bisamides, and other polyamides.

Examples of the monoamides include lauric acid amide, palmitic acid amide, stearic acid amide, behenic acid amide, hydroxystearic acid amide, saturated fatty acid amide, oleic acid amide, erucic acid amide, unsaturated fatty acid amide, p-toluamide, p-toluene methanamide, aromatic amide, hexamethylene hydroxystearic acid amide, substituted amide, methylolstearic acid amide, methylolamide, and fatty acid ester amide.

Examples of the bisamide include methylenebis(stearamide), ethylenebis(lauramide), ethylenebis(hydroxy fatty acid (C6-24) amide, ethylenebis(stearamide), ethylenebis(hydroxystearamide), saturated fatty acid bisamide, methylenebis(oleamide), unsaturated fatty acid bisamide, m-xylylenebis(stearamide), and aromatic bisamide.

Examples of other polyamides include saturated fatty acid polyamides, unsaturated fatty acid polyamides, aromatic polyamides, 1,2,3-propane tricarboxylic acid tris(2-methylcyclohexylamide), cyclic amide oligomers, and acyclic amide oligomers.

Examples of the cyclic amide oligomers include: amide oligomers in which a dicarboxylic acid and a diamine are cyclically polycondensed; amide oligomers in which a tricarboxylic acid and a diamine are cyclically polycondensed; amide oligomers in which a dicarboxylic acid and a triamine are cyclically polycondensed; amide oligomers in which a tricarboxylic acid and a triamine are cyclically polycondensed; amide oligomers in which a dicarboxylic acid, a tricarboxylic acid and a diamine are cyclically polycondensed; amide oligomers in which a dicarboxylic acid, tricarboxylic acid and a triamine are cyclically polycondensed; amide oligomers in which a dicarboxylic acid, a diamine and a triamine are cyclically polycondensed; amide oligomers in which a tricarboxylic acid, a diamine and a triamine are cyclically polycondensed; and amide oligomers in which a dicarboxylic acid, a tricarboxylic acid, a diamine and a triamine are cyclically polycondensed.

Examples of the acyclic amide oligomers include: amide oligomers in which a monocarboxylic acid and a diamine and/or triamine are acyclically polycondensed; and amide oligomers in which a dicarboxylic acid and/or tricarboxylic acid and a monoamine are acyclically polycondensed. In the case of an amide oligomer including a monocarboxylic acid or a monoamine, the monocarboxylic acid or the monoamine serves as a terminal molecule to form an acyclic amide oligomer having a small molecular weight. In the case of an acyclic amide oligomer in which a dicarboxylic acid and/or tricarboxylic acid, and a diamine and/or triamine are acyclically polycondensed, an acyclic high molecular-based amide polymer is obtained. Additional examples of the acyclic amide oligomers include amide oligomers in which a monocarboxylic acid and a monoamine are acyclically condensed.

Examples of the wax-based thixotropic agent include ester compounds and specific examples thereof include hydrogenated castor oil.

Examples of the sorbitol-based thixotropic agent include dibenzylidene-D-sorbitol, bis(4-methylbenzylidene)-D-sorbitol, (D-)sorbitol, monobenzylidene(-D-)sorbitol, and mono(4-methylbenzylidene)-(D-)sorbitol.

<Other Components>

The flux according to the present embodiment may further contain, as needed, other components, in addition to the solvent and the thixotropic agents.

Examples of other components include: active agents such as organic acids, amines, and halogen compounds; surfactants; metal deactivators; antioxidants; silane coupling agents; and colorants.

<<Active Agents>>

Examples of the active agents include organic acids, amines, and halogen compounds.

[Organic Acids]

Examples of the organic acids include carboxylic acids and organic sulfonic acids. Examples of the carboxylic acids include aliphatic carboxylic acids and aromatic carboxylic acids. Examples of the aliphatic carboxylic acids include aliphatic monocarboxylic acids and aliphatic dicarboxylic acids.

Examples of the aliphatic monocarboxylic acids include caproic acid, enanthic acid, caprylic acid, pelargonic acid, isopelargonic acid, capric acid, caproleic acid, lauric acid (dodecanoic acid), undecanoic acid, linderic acid, tridecanoic acid, myristoleic acid, pentadecanoic acid, isopalmitic acid, palmitoleic acid, hiragonic acid, hydnocarpic acid, margaric acid, isostearic acid, elaidic acid, petroselinic acid, moroctic acid, eleostearic acid, tariric acid, vaccenic acid, ricinoleic acid, vernolic acid, sterculynic acid, nonadecanoic acid, eicosanoic acid, stearic acid, 12-hydroxystearic acid, oleic acid, linoleic acid, linolenic acid, and myristic acid.

Examples of the aliphatic dicarboxylic acids include oxalic acid, malonic acid, succinic acid, glutaric acid, adipic acid, pimelic acid, suberic acid, azelaic acid, sebacic acid, dodecanedioic acid, eicosanedioic acid, tartaric acid, 2,4-diethylglutaric acid, diglycolic acid, 2-methylnonanedioic acid, 4-(methoxycarbonyl)-2,4-dimethylundecanedioic acid, 4,6-bis(methoxycarbonyl)-2,4,6-trimethyltridecanedioic acid, and 8,9-bis(methoxycarbonyl)-8,9-dimethylhexadecanedioic acid.

Examples of the aromatic carboxylic acids include salicylic acid, dibutyl aniline diglycolic acid, terephthalic acid, parahydroxyphenylacetic acid, phenylsuccinic acid, phthalic acid, benzoic acid, 2,3-dihydroxybenzoic acid, 2-quinolinecarboxylic acid, 3-hydroxybenzoic acid, and p-anisic acid.

Additional examples of the carboxylic acid include tris(2-carboxyethyl) isocyanurate, and 1,3-cyclohexanedicarboxylic acid.

Additional examples of the carboxylic acid include compounds of the following general formula (c1).

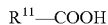 (c1)

[In the formula, $R^{11}$ is a chained hydrocarbon group having 2 to 15 carbon atoms, an alicyclic hydrocarbon group having 3 to 15 carbon atoms or an aromatic group. $R^{11}$ has a hydroxy group.]

The chained hydrocarbon group as $R^{11}$ may be linear or branched.

The chained hydrocarbon group and the alicyclic hydrocarbon group may be each a saturated hydrocarbon group or an unsaturated hydrocarbon group, and are preferably saturated hydrocarbon groups.

The carbon number of the chained hydrocarbon group is preferably 2 to 12, more preferably 3 to 9, particularly preferably 3 to 7, and most preferably 3 to 5.

Examples of the chained hydrocarbon group include methyl group, ethyl group, n-propyl group, isopropyl group, n-butyl group, isobutyl group, sec-butyl group, tert-butyl group, n-pentyl group, isopentyl group, sec-pentyl group, tert-pentyl group, neopentyl group, n-hexyl group, isohexyl group, sec-hexyl group, tert-hexyl group, and neohexyl group.

The carbon number of the alicyclic hydrocarbon group is preferably 3 to 12, more preferably 4 to 12, and even more preferably 4 to 8.

Examples of the alicyclic hydrocarbon group include cyclopropyl group, cyclobutyl group, cyclopentyl group, cyclohexyl group, cycloheptyl group, cyclooctyl group, cyclononyl group, cyclodecyl group, and cycloundecyl group.

The aromatic group as $R^{11}$ is a group having at least one aromatic ring, and examples thereof include: aromatic hydrocarbon rings such as benzene, naphthalene, anthracene, and phenanthrene; aromatic heterocyclic rings in which carbon atoms constituting an aromatic hydrocarbon ring are partially substituted with hetero atoms; and condensed rings in which an aromatic hydrocarbon ring and an aromatic heterocyclic ring are condensed.

In the case where an aromatic hydrocarbon group as $R^{11}$ has a substituent, examples of the substituent include hydrocarbon groups having 1 to 20 carbon atoms, aromatic hydrocarbon groups, a carboxy group, a hydroxy group, an amino group, and halogen atoms, and a carboxy group or a hydroxy group is preferable.

Examples of the organic acids of the general formula (c1) include hydroxycarboxylic acids.

Examples of the hydroxycarboxylic acids include 2,2-bis(hydroxymethyl)propionic acid, 2,2-bis(hydroxymethyl)butanoic acid, citric acid, isocitric acid, malic acid, and tartaric acid, and 2,2-bis(hydroxymethyl)propionic acid is preferable.

Additional examples of the carboxylic acid include dimer acids, trimer acids, hydrogenated dimer acids which are hydrogenated products formed by adding hydrogen to dimer acids, and hydrogenated trimer acids which are hydrogenated products formed by adding hydrogen to trimer acids.

Examples of the dimer acids and the trimer acids include a dimer acid which is a reaction product of an oleic acid and a linoleic acid, a trimer acid which is a reaction product of an oleic acid and a linoleic acid, a dimer acid which is a reaction product of an acrylic acid, a trimer acid which is a reaction product of an acrylic acid, a dimer acid which is a reaction product of a methacrylic acid, a trimer acid which is a reaction product of a methacrylic acid, a dimer acid which is a reaction product of an acrylic acid and a methacrylic acid, a trimer acid which is a reaction product of an acrylic acid and a methacrylic acid, a dimer acid which is a reaction product of an oleic acid, a trimer acid which is a reaction product of an oleic acid, a dimer acid which is a reaction product of a linoleic acid, a trimer acid which is a reaction product of a linoleic acid, a dimer acid which is a reaction product of a linolenic acid, a trimer acid which is a reaction product of a linolenic acid, a dimer acid which is a reaction product of an acrylic acid and an oleic acid, a trimer acid which is a reaction product of an acrylic acid and an oleic acid, a dimer acid which is a reaction product of an acrylic acid and a linoleic acid, a trimer acid which is a reaction product of an acrylic acid and a linoleic acid, a dimer acid which is a reaction product of an acrylic acid and a linolenic acid, a trimer acid which is a reaction product of an acrylic acid and a linolenic acid, a dimer acid which is a reaction product of a methacrylic acid and an oleic acid, a trimer acid which is a reaction product of a methacrylic acid and an oleic acid, a dimer acid which is a reaction product of a methacrylic acid and a linoleic acid, a trimer acid which is a reaction product of a methacrylic acid and a linoleic acid, a dimer acid which is a reaction product of a methacrylic acid and a linolenic acid, a trimer acid which is a reaction product of a methacrylic acid and a linolenic acid, a dimer acid which is a reaction product of an oleic acid and a linolenic acid, a trimer acid which is a reaction product of an oleic acid and a linolenic acid, a dimer acid which is a reaction product of a linoleic acid and a linolenic acid, a trimer acid which is a reaction product of a linoleic acid and a linolenic acid, hydrogenated dimer acids which are hydrogenated products of each dimer acid mentioned above, and hydrogenated trimer acid which are hydrogenated products of each trimer acid mentioned above.

For example, the dimer acid which is a reaction product of an oleic acid and a linoleic acid is a dimer having 36 carbon atoms. The trimer acid which is a reaction product of an oleic acid and a linoleic acid is a trimer having 54 carbon atoms.

Additional examples of the carboxylic acid include compounds of the following general formula (a1).

[Chemical formula 3]

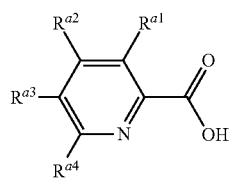

(a1)

In the formula (a1), $R^{a1}$, $R^{a2}$, $R^{a3}$ and $R^{a4}$ are each independently a hydrocarbon group, a hydroxy group, a halogen atom or a hydrogen atom.

Examples of the hydrocarbon group as $R^{a1}$, $R^{a2}$, $R^{a3}$ and $R^{a4}$ include chained hydrocarbon groups having 1 to 20 carbon atoms with optional substituent, alicyclic hydrocarbon groups having 3 to 20 carbon atoms with optional substituent, an amino group, a hydroxy group, and a carboxy group.

The chained hydrocarbon group may be linear or branched. The chained hydrocarbon group may be a saturated hydrocarbon group or an unsaturated hydrocarbon group, and is preferably a saturated hydrocarbon group.

The alicyclic hydrocarbon group may be a polycyclic group or a monocyclic group. The monocyclic alicyclic hydrocarbon group is preferably a group formed by removing at least one hydrogen atom from monocycloalkane. The polycyclic alicyclic hydrocarbon group is preferably a group formed by removing at least one hydrogen atom from polycycloalkane.

Examples of the substituent which the hydrocarbon group as $R^{a1}$, $R^{a2}$, $R^{a3}$ and $R^{a4}$ may have include an amino group, a hydroxy group, a carboxy group, an acyl group, an alkoxy group, a carbonyl group, and halogen atoms.

The hydrocarbon group is preferably a chained hydrocarbon group having one to five carbon atoms which may have a substituent or a carboxy group. Examples of the chained hydrocarbon group include a methyl group, an ethyl group, a n-propyl group, an isopropyl group, a n-butyl group, an isobutyl group, a sec-butyl group, a tert-butyl group, a n-pentyl group, an isopentyl group, a sec-pentyl group, a tert-pentyl group, and a neopentyl group. The hydrocarbon group is preferably a carboxy group.

Examples of the compound of the general formula (a1) include picolinic acid, dipicolinic acid, and 3-hydroxypicolinic acid.

The picolinic acid is a compound of the general formula (a1) in which $R^{a1}$, $R^{a2}$, $R^{a3}$ and $R^{a4}$ are hydrogen atoms.

The 3-hydroxypicolinic acid is a compound of the general formula (a1) in which $R^{a1}$ is a hydroxy group, and $R^{a2}$, $R^{a3}$ and $R^{a4}$ are hydrogen atoms.

Examples of the organic sulfonic acids include aliphatic sulfonic acids and aromatic sulfonic acids. Examples of the aliphatic sulfonic acids include alkanesulfonic acids and alkanolsulfonic acids.

Examples of the alkanesulfonic acids include methanesulfonic acid, ethanesulfonic acid, 1-propanesulfonic acid, 2-propanesulfonic acid, 1-butanesulfonic acid, 2-butanesulfonic acid, pentanesulfonic acid, hexanesulfonic acid, decanesulfonic acid, and dodecanesulfonic acid.

Examples of the alkanolsulfonic acids include 2-hydroxyethane-1-sulfonic acid, 2-hydroxypropane-1-sulfonic acid, 2-hydroxybutane-1-sulfonic acid, 2-hydroxypentane-1-sulfonic acid, 1-hydroxypropane-2-sulfonic acid, 3-hydroxypropane-1-sulfonic acid, 4-hydroxybutane-1-sulfonic acid, 2-hydroxyhexane-1-sulfonic acid, 2-hydroxydecane-1-sulfonic acid and 2-hydroxydodecane-1-sulfonic acid.

Examples of the aromatic sulfonic acids include 1-naphthalenesulfonic acid, 2-naphthalenesulfonic acid, p-toluenesulfonic acid, xylenesulfonic acid, p-phenolsulfonic acid, cresolsulfonic acid, sulfosalicylic acid, nitrobenzenesulfonic acid, sulfobenzoic acid and diphenylamine-4-sulfonic acid.

One type of organic acids may be used alone or at least two types thereof may be used in combination.

As the organic acid, an aliphatic carboxylic acid is preferably, and an aliphatic dicarboxylic acid is more preferable.

The organic acid is preferably an aliphatic dicarboxylic acid, and preferably contain at least one type selected from the group consisting of diglycolic acid, 2-methylnonanedioic acid, 4-(methoxycarbonyl)-2,4-dimethylundecanedioic acid, 4,6-bis(methoxycarbonyl)-2,4,6-trimethyltridecanedioic acid, and 8,9-bis(methoxycarbonyl)-8,9-dimethylhexadecanedioic acid, and more preferably contain at least one type selected from the group consisting of diglycolic acid and an organic acid mixture of 2-methylnonanedioic acid, 4-(methoxycarbonyl)-2,4-dimethylundecanedioic acid, 4,6-bis(methoxycarbonyl)-2,4,6-trimethyltridecanedioic acid, and 8,9-bis(methoxycarbonyl)-8,9-dimethylhexadecanedioic acid.

[Amine]

Examples of the amine include azoles, guanidines, aminoalcohols, alkylamine compounds, and amine polyoxyalkylene adducts.

Examples of the azoles include 2-methylimidazole, 2-ethylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, 2,4-diamino-6-vinyl-s-triazine, 2,4-diamino-6-vinyl-s-triazine isocyanuric acid adduct, 2,4-diamino-6-methacryloyloxyethyl-s-triazine, epoxy-imidazole adduct, 2-methylbenzimidazole, 2-octylbenzimidazole, 2-pentylbenzimidazole, 2-(1-ethylpentyl)benzimidazole, 2-nonylbenzimidazole, 2-(4-thiazolyl)benzimidazole, benzimidazole, 1,2,4-triazole, 2-(2'-hydroxy-5'-methylphenyl)benzotriazole, 2-(2'-hydroxy-3'-tert-butyl-5'-methylphenyl)-5-chlorobenzotriazole, 2-(2'-hydroxy-3',5'-di-tert-amylphenyl)benzotriazole, 2-(2'-hydroxy-5'-tert-octylphenyl)benzotriazole, 2,2'-methylenebis[6-(2H-benzotriazol-2-yl)-4-tert-octylphenol], 6-(2-benzotriazolyl)-4-tert-octyl-6'-tert-butyl-4'-methyl-2,2'-methylenebisphenol, 1,2,3-benzotriazole, 1-[N,N-bis(2-ethylhexyl)aminomethyl]benzotriazole, carboxybenzotriazole, 1-[N,N-bis(2-ethylhexyl)aminomethyl]methylbenzotriazole, 2,2'-[[(methyl-1H-benzotriazol-1-yl)methyl]imino]bisethanol, 1-(1',2'-dicarboxyethyl)benzotriazole, 1-(2,3-dicarboxypropyl)benzotriazole, 1-[(2-ethylhexylamino)methyl]benzotriazole, 2,6-bis[(1H-benzotriazol-1-yl)methyl]-4-methylphenol, 5-methylbenzotriazole, and 5-phenyltetrazole.

Examples of the guanidines include 1,3-diphenylguanidine, 1,3-di-o-tolylguanidine, 1-o-tolylbiguanide, 1,3-di-o-cumenylguanidine, and 1,3-di-o-cumenyl-2-propionylguanidine.

Examples of the aminoalcohols include N,N,N',N'-tetrakis(2-hydroxypropyl)ethylene diamine, N,N,N',N'-tetrakis(2-hydroxyethyl)ethylene diamine, monoethanolamine, diethanolamine, triethanolamine, 1-amino-2-propanol, bis(2-hydroxypropyl)amine, and tris(2-hydroxypropyl)amine.

Examples of the alkylamine compounds include ethylamine, triethylamine, ethylenediamine, triethylenetetramine, cyclohexylamine, hexadecylamine, and stearylamine.

Examples of the amine polyoxyalkylene adducts include diamine-terminated polyalkylene glycol, aliphatic amine polyoxyalkylene adducts, aromatic amine polyoxyalkylene adducts, and polyvalent amine polyoxyalkylene adducts.

Examples of an alkylene oxide added to the amine polyoxyalkylene adduct include ethylene oxide, propylene oxide, and butylene oxide.

The diamine-terminated polyalkylene glycol is a compound in which both terminals of a polyalkylene glycol are aminated.

Examples of the diamine-terminated polyalkylene glycol include diamine-terminated polyethylene glycol, diamine-terminated polypropylene glycol, and diamine-terminated polyethylene glycol-polypropylene glycol copolymers.

Examples of the diamine-terminated polyethylene glycol-polypropylene glycol copolymers include polyethylene glycol-polypropylene glycol copolymer bis(2-aminopropyl)ether, and polyethylene glycol-polypropylene glycol copolymer bis(2-aminoethyl)ether.

The aliphatic amine polyoxyalkylene adducts, the aromatic amine polyoxyalkylene adducts, and the polyvalent amine polyoxyalkylene adducts are compounds each in which a polyoxyalkylene group is bonded to a nitrogen atom of an amine. Examples of the amine include ethylene diamine, 1,3-propane diamine, 1,4-butane diamine, hexamethylene diamine, diethylene triamine, lauryl amine, stearyl amine, oleyl amine, beef fat amine, hardened beef fat amine, beef fat propyl diamine, meta-xylene diamine, tolylene diamine, para-xylene diamine, phenylene diamine, isophorone diamine, 1,10-decane diamine, 1,12-dodecane diamine, 4,4-diaminodicyclohexylmethane, 4,4-diaminodiphenylmethane, butane-1,1,4,4-tetraamine, and pyrimidine-2,4,5,6-tetraamine.

One type of the amines may be used alone or at least two types thereof may be used in combination.

It is preferable that the flux according to the present embodiment do not contain resin components. The absence of resin components tends to decrease the amount of the flux residue.

In the present specification, examples of the resin components include rosins and resins other than rosins.

In the present specification, the term "rosin" encompasses natural resins containing a mixture of abietic acid and isomers thereof in which the abietic acid is the main component thereof, and resins obtained by chemically modifying natural resins (may be referred to as "rosin derivatives").

Examples of the rosin derivatives include a purified rosin and a modified rosin.

As the modified rosin, a hydrogenated rosin, a polymerized rosin, a polymerized hydrogenated rosin, a disproportionated rosin, an acid-modified rosin, a rosin ester, an acid-modified hydrogenated rosin, an acid anhydride-modified hydrogenated rosin, an acid-modified disproportionated rosin, an acid anhydride-modified disproportionated rosin, a phenol-modified rosin, an α,β unsaturated carboxylic acid-modified product (such as an acrylated rosin, a maleated rosin, and a fumarated rosin), purified products, hydrides, and disproportionated products of polymerized rosin, purified products, hydrides, and disproportionated products of an α,β unsaturated carboxylic acid-modified product, a rosin alcohol, a rosin amine, a hydrogenated rosin alcohol, a rosin ester, a hydrogenated rosin ester, a rosin soap, a hydrogenated rosin soap, and an acid-modified rosin soap are exemplary examples.

Examples of resins other than the rosins include terpene resin, modified terpene resin, terpene phenol resin, modified terpene phenol resin, styrene resin, modified styrene resin, xylene resin, modified xylene resin, acrylic resin, polyethylene resin, acryl-polyethylene copolymer resin, and other thermosetting resin.

Examples of the modified terpene resin include aromatic modified terpene resin, hydrogenated terpene resin, and hydrogenated aromatic modified terpene resin. Examples of the modified terpene phenol resin include hydrogenated terpene phenol resin. Examples of the modified styrene resin include styrene acrylic resin, and styrene maleic resin. Examples of the modified xylene resin include phenol-modified xylene resin, alkylphenol-modified xylene resin, phenol-modified resol-type xylene resin, polyol modified xylene resin, and polyoxyethylene-added xylene resin.

Examples of other thermosetting resins include epoxy resins.

Examples of the epoxy resins include bisphenol A type epoxy resin, bisphenol F type epoxy resin, bisphenol S type epoxy resin, glycidyl amine type resin, alicyclic epoxy resin, aminopropane type epoxy resin, biphenyl type epoxy resin, naphthalene type epoxy resin, anthracene type epoxy resin, triazine type epoxy resin, dicyclopentadiene type epoxy resin, triphenylmethane type epoxy resin, fluorine type epoxy resin, phenolaralkyl type epoxy resin, and novolac type epoxy resin.

It has been conventionally proposed that the amount of rosin in a flux is reduced so as to decrease flux residue. The flux in which the amount of rosin is reduced difficultly realizes rheological properties of the flux, such as the viscosity or thixotropic ratio thereof.

The above-mentioned flux according to the present embodiment can reduce flux residue and suppress heating sagging by containing both the first solvent and the particular polyamide. Although the reason why such effects are exhibited is not certain, the reason is assumed as follows.

The particular polyamide having at least three amide bonds in the molecule thereof easily improves heating sagging-suppressibility in comparison with a monoamide or a bisamide. The flux according to the present embodiment can suppress heating sagging even when no rosin is contained.

The particular polyamide easily improves heating sagging-suppressibility in comparison with a monoamide or a bisamide. However, a flux containing the particular polyamide generally tends to cause flux residue after reflow.

Since the particular polyamide easily improves the heating sagging-suppressibility, an addition amount thereof required to realize a predetermined heating sagging-suppressibility can be reduced. Furthermore, since the flux according to the present embodiment tends to leave the first solvent after preheating and before main heating, a thixotropic agent, an active agent, or the like is easily prevented from being dried to a solid. In addition, the first solvent of the flux according to the present embodiment is easily volatilized during the main heating of reflow. These synergistic effects make it possible to reduce flux residue caused from a thixotropic agent, an active agent, a first solvent and the like by containing the first solvent even when a particular polyamide is contained in the flux according to the present embodiment.

(Solder Paste)

A solder paste according to the second aspect contains a solder alloy powder and the above-mentioned flux.

The solder alloy powder may be composed of an Sn-only solder powder; or a powder of an Sn—Ag-based, Sn—Cu-based, Sn—Ag—Cu-based, Sn—Bi-based, or Sn—In-based solder alloy, or a powder of solder alloys in which Sb, Bi, In, Cu, Zn, As, Ag, Cd, Fe, Ni, Co, Au, Ge, P, or the like has been added to the above-mentioned alloys.

The solder alloy powder may be composed of a powder of an Sn—Pb-based solder alloy, or a powder of a solder alloy in which Sb, Bi, In, Cu, Zn, As, Ag, Cd, Fe, Ni, Co, Au, Ge, P, or the like has been added to the Sn—Pb-based solder alloy.

The solder alloy powder is preferably a Pb-free solder.

As the solder alloy powder, a solder alloy powder having a melting temperature of 150° C. to 250° C. may be used.

Amount of Flux:

In the solder paste, the amount of the flux relative to the total mass of the solder paste is preferably 5% by mass to 30% by mass, and more preferably 5% by mass to 15% by mass.

The above-mentioned solder paste according to the present embodiment makes it possible to reduce flux residue and suppress heating sagging.

(Method for Producing a Bonded Body)

A method for producing a bonded body according to the third aspect includes a step in which a part and a substrate are soldered to obtain a bonded body, wherein reflow is carried out under reducible gas atmosphere using the solder paste according to the second aspect at the time of soldering.

One embodiment of the method for producing a bonded body according to the third aspect will be explained below.

The method for producing a bonded body according to the present embodiment includes: a step of applying a solder paste; a step of mounting a part; and a reflow step, in this order.

In the step of applying a solder paste, the solder paste according to the second aspect is applied on the surface of a substrate.

Examples of the substrate include a printed wiring board and a wafer.

Examples of the method of applying a solder paste include: a method in which a solder paste is applied by printing using a mask with openings; a method in which a solder paste is discharged using a dispenser, or the like; and a method in which a solder paste is transferred using a probe pin or the like.

In the step of mounting a part, a part is mounted on the surface of a substrate on which a solder paste is applied.

Examples of the part include chips, integrated circuits, transistors, diodes, resistors, and capacitors.

Although the atmosphere at the reflow step is not particularly limited, as long as effects of the present invention are exhibited, examples thereof include nitrogen gas atmosphere and reducible gas atmosphere.

The reducible gas atmosphere may be formed by, for example, volatilizing a reducible compound in a reflow furnace, or by bubbling nitrogen through a liquid reducible compound to supply the resultant reducible gas to a reflow furnace. The reducible compound is preferably a formic acid.

When the atmosphere at the reflow step is the reducible gas atmosphere, the amount of an active agent in the used solder paste may be decreased, and no active agents may be contained. Thus, flux residue can be reduced.

In the reflow step, the substrate after mounting a part is heated in a reflow furnace at a temperature higher than the melting point of a solder powder contained in the solder paste (namely, peak temperature) (this step being referred to as a main heating step). The heating temperature may be, for example, a temperature higher than the melting point of a solder powder by 5° C. to 30° C. The heating time may be, for example, ten seconds to two minutes.

The reflow step may include a preheat step before the main heating step.

In the preheat step, a substrate after mounting a part is heated in a reflow furnace at a temperature lower than the melting point of a solder powder contained in the solder paste. The heating temperature may be, for example, 150° C. to 180° C. The heating time may be, for example, 30 seconds to two minutes.

In the preheat step, the interior of the reflow furnace may be under the above-mentioned nitrogen gas atmosphere or the reducible gas atmosphere The above-mentioned method for producing a bonded body according to the present embodiment makes it possible to reduce flux residue and suppress heating sagging, thereby enhancing the bonding strength of the resultant bonded body. In addition, the risk of occurring short circuits in a substrate can be reduced.

EXAMPLES

Although the present invention will be explained below with reference to examples, the present invention is not limited to the following examples.

<Preparation of Flux>

Examples 1 to 23 and Comparative Examples 1 to 4

Each flux having a constitution shown in Tables 1 to 4 of examples and comparative examples was prepared.

Raw materials used are shown below.
Solvent:
First Solvent:
Isobornyl cyclohexanol: The boiling point was 318° C., and the viscosity at 30° C. was 10 Pa·s or more.
Trimethylolpropane: The melting point was 60° C., and the boiling point was 295° C.
Second Solvent:
Diethylene glycol monohexyl ether (the relative permittivity was 6.58, and the boiling point was 259° C.)
The diethylene glycol monohexyl ether was a compound of the general formula (1) in which $R^1$ was an ethylene group, $R^2$ was a linear hexyl group, and m was 2.
Other Solvents:
Ethylene glycol monophenyl ether (the relative permittivity was 6.01, and the boiling point was 237° C.)
Propylene glycol monophenyl ether (the relative permittivity was 4.47, and the boiling point was 243° C.)
Diethylene glycol mono-2-ethylhexyl ether (the relative permittivity was 5.04, and the boiling point was 272° C.)
Tripropylene glycol n-butyl ether (the relative permittivity was 4.48, and the boiling point was 274° C.)
Diethylene glycol monobutyl ether (the relative permittivity was 8.37, and the boiling point was 231° C.)
Isostearyl alcohol (the relative permittivity was 2.67, and the boiling point was 304° C.)
2-Methylpentane-2,4-diol (the relative permittivity was 4.47, and the boiling point was 197° C.)
α-Terpineol (the relative permittivity was 3.04, and the boiling point was 218° C.)
Thixotropic Agent:
Polyamide:
A polyamide obtained by the following method was used.
12-Hydroxystearic acid and dodecanedioic acid were added and heated to approximately 100° C., followed by adding hexamethylenediamine thereto, heating the mixture to approximately 220° C., and maintaining the temperature for three hours to obtain a polyamide of Preparation Example 1.
X mol of dodecanedioic acid, Y mol of 12-hydroxystearic acid, and Z mol of hexamethylenediamine were used as raw materials. The amount by mol of the raw materials satisfied the relational expression: 2Z=2X+Y.
Other Thixotropic Agents:
Stearic acid amide, N,N'-methylenebis(stearamide), and hydrogenated castor oil.

Active Agent:
Mixture of organic acids (mixtures of organic acids consisting of 2-methylnonanedioic acid, 4-(methoxycarbonyl)-2,4-dimethylundecanedioic acid, 4,6-bis(methoxycarbonyl)-2,4,6-trimethyltridecanedioic acid, and 8,9-bis(methoxycarbonyl)-8,9-dimethylhexadecanedioic acid.)
Diglycolic Acid The boiling point values of the compounds used in examples were the measured values of the temperature of target liquid at which the saturated vapor pressure of the target liquid was equal to one atmosphere (namely, 1013 hPa).
Weight Loss Rate:
The weight loss rate of the solvent was measured, as follows.
10 mg of a target sample to be measured was placed in an aluminum pan, and heated such that the temperature thereof was increased to a specific temperature at a rate of 10° C./min with a differential thermal/thermogravimetric simultaneous analyzer (manufactured by Hitachi High-Tech Science Corporation, STA7200). Then, the weight loss rate was calculated from the mass $W_0$ of the target sample before heating and the mass $W_1$ of the target sample when the temperature of the target sample reached a specific temperature in accordance with the following equation.

Weight loss rate (% by mass)=100×($W_0-W_1$)/$W_0$

Figure 2:
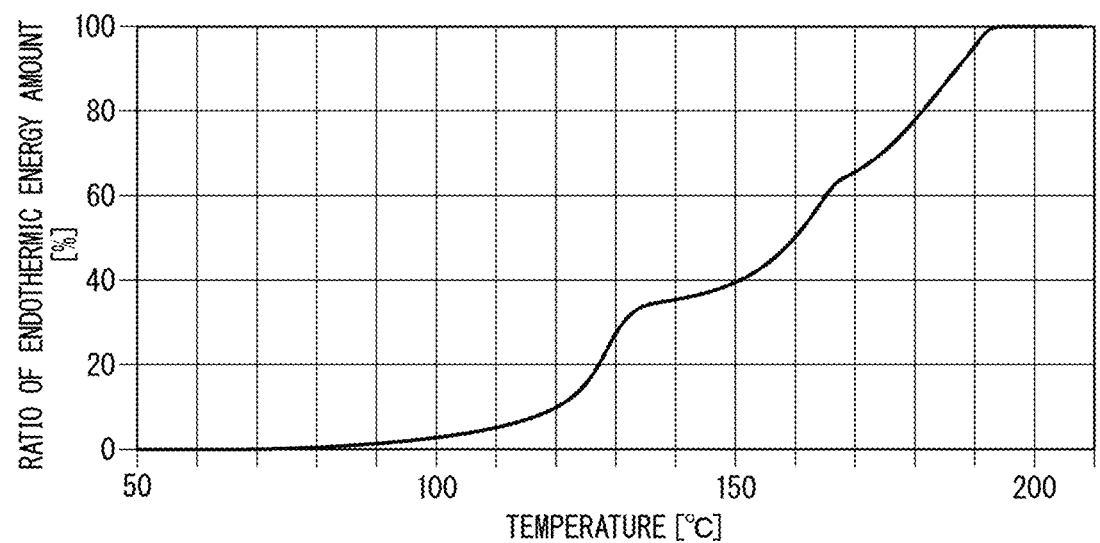
FIG. 2 A graph showing the relationship between the ratio of the endothermic energy amount of a polyamide contained in a flux according to one embodiment of the present invention and the temperature.

Weight Loss Rate when Heated to 230° C.
Isobornyl cyclohexanol: 81% by mass
Trimethylolpropane: 94% by mass
Weight Loss Rate when Heated to 250° C.
Isobornyl cyclohexanol: 99% by mass or more
Trimethylolpropane: 99% by mass or more
Relative Permittivity:
The relative permittivity of solvent was measured in accordance with JIS C 2565 (1992) at a measurement frequency of 1 GHz.
Endothermic Peak of Polyamide
The temperature of the endothermic peak of the polyamide of Preparation Example 1 was measured by DSC (Differential Scanning calorimetry).
In more detail, the endothermic peak was measured by heating approximately seven mg of the polyamide of Preparation Example 1 from 30° C. to 220° C. at a heating rate of 20° C./min under a nitrogen atmosphere. DSC7020 (manufactured by Hitachi High-Tech Science Corporation) was used as a measurement device. The temperature at the top of the peak was defined as the temperature of the endothermic peak. The measured result is shown in FIG. 1.
All of the temperatures of the endothermic peaks at the tops of the peaks of the obtained polyamide falls within a range of 120° C. to 200° C.
Ratio of Endothermic Energy Amount of Polyamide
The ratio of the endothermic energy amount of the polyamide of Preparation Example 1 at a specified temperature was calculated as follows.
The endothermic energy amount of the polyamide was calculated from a peak area of a DSC curve of the polyamide.
Here, the expression "the ratio of the endothermic energy amount at a specified temperature" means the ratio of the endothermic energy amount within a range of 50° C. to the specified temperature relative to the total endothermic energy amount within a range of 50° C. to 200° C. The result was shown in FIG. 2.
<Preparation of Solder Paste>
A solder paste was prepared by mixing each flux of Examples 1 to 22 and Comparative Examples 1 to 4 with the below-mentioned solder alloy powder (1). All of the prepared solder pastes was composed of 10% by mass of the flux and 90% by mass of the solder alloy powder.

A solder paste was prepared by mixing the flux of Example 23 with the below-mentioned solder alloy powder (2). The prepared solder paste was composed of 12.5% by mass of the flux and 87.5% by mass of the solder alloy powder.

The solder alloy powder (1) was a powder composed of a solder alloy consisting of 3% by mass of Ag, 0.5% by mass of Cu, and a balance of Sn. The solidus temperature of the solder alloy was 217° C. and the liquidus temperature thereof was 219° C. The size of the solder alloy powder (1) was a size (grain size distribution) satisfying Symbol 4 in the powder size classification (Table 2) in JIS Z 3284-1:2014.
Size (Grain Size Distribution) Satisfying Symbol 4:

The ratio of the major axis of the powder to the minor axis thereof was 1.2 or less.

The length of the minor axis of the powder was 40 µm or less.

The amount of powders having a minor axis length exceeding 38 µm relative to the total mass (100% by mass) of the powders was 1% by mass or less.

The amount of the powders having a minor axis length of 20 µm or more and 38 µm or less relative to the total mass (100% by mass) of the powders was 80% by mass or more.

The amount of the powders having a minor axis length of less than 20 µm relative to the total mass (100% by mass) of the powders was 10% by mass or less.

The solder alloy powder (2) was a powder composed of a solder alloy consisting of 5% by mass of Sb and a balance of Sn. The solidus temperature of the solder alloy was 240° C. and the liquidus temperature thereof was 243° C. The size of the solder alloy powder (2) was the same as that of the solder alloy powder (1).

<<Evaluation of amount of flux residue>>, <<Evaluation of heating sagging-suppressibility>>, <<Evaluation of solder ball generation-suppressibility>>, <<Evaluation of tacking>>, and <<Evaluation of mountability of parts>> were carried out by evaluation methods described in the following <Evaluation>. These evaluation results are shown in Tables 1 to 4.
<Evaluation>
<<Evaluation of Amount of Flux Residue>>
Evaluation Method:

10 mg of a flux of each example was placed in an aluminum pan, and heated such that the temperature thereof was increased to 250° C. at a rate of 10° C./min with a differential thermal/thermogravimetric simultaneous analyzer (manufactured by Hitachi High-Tech Science Corporation, STA7200). Then, the remaining ratio was calculated from the mass $W_0$ of the target sample before heating and the mass $W_1$ of the target sample when the temperature of the target sample reached 250° C. in accordance with the following equation.

Remaining ratio (%)=100×$W_1/W_0$

Evaluation Criteria:
A: The remaining ratio was less than 10%.
B: The remaining ratio was 10% or more.

Figure 3:
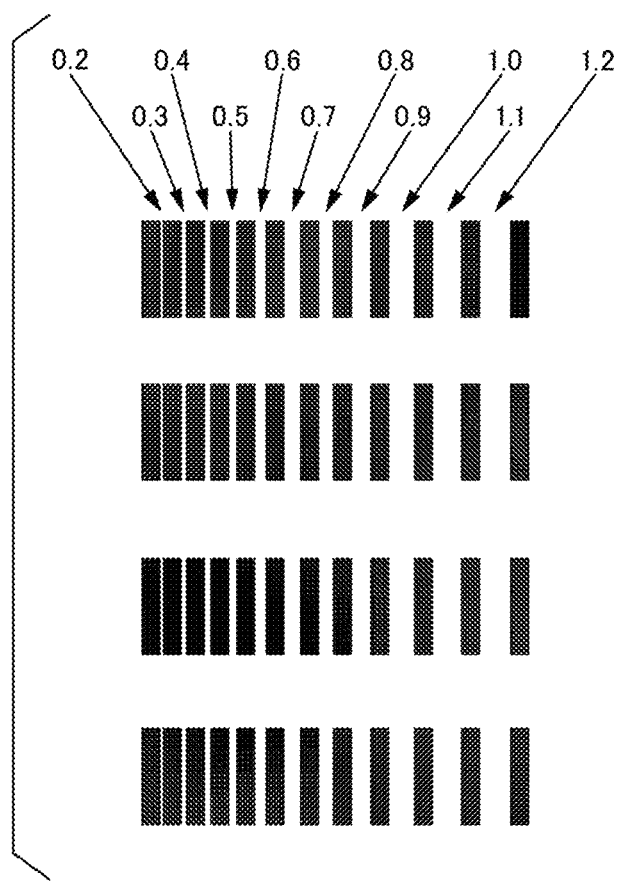
FIG. 3 A drawing which schematically indicates pattern holes of I in evaluation of heating sagging-suppressibility.

A flux evaluated as A was considered to be acceptable, and a flux evaluated as B was considered to be unacceptable.
<<Evaluation of Heating Sagging-Suppressibility>>
Evaluation Method:

The heating sagging of the prepared solder paste was evaluated by the method described in the section "Test of sagging during heating" of JIS Z 3284-3:2014. First, a test plate was obtained by printing the solder paste using a metal mask in which pattern holes of I (hole size 3.0×0.7) in FIG. 6 described in the section "Test of sagging during printing" were arranged. The obtained test plate was left still at 150° C. for three minutes in a thermostatic chamber. The schematic diagram of the pattern of I mentioned above is shown in FIG. 3. In FIG. 3, the numerical values of 0.2 to 1.2 indicate distances between pattern holes. The test plate after heating was evaluated in terms of the minimum interval at which all the printed solder paste was not integrated.
<<Evaluation of Solder Ball Generation-Suppressibility>>
Evaluation Method:

A pattern having a diameter of 1.6 mm and a thickness of 0.12 mm was printed with the prepared solder paste on a printed circuit board having a land pattern for mounting chip parts using a metal mask. Next, 30 of 3216 chip capacitors were mounted using a mounter (NPM-W2, manufactured by Panasonic Corporation) on the printed circuit board after printing. Next, it was evaluated whether solder balls (referred to as chip side balls or capillary balls) were generated around the chip parts.
Evaluation Criteria:
A: No solder balls with a diameter of 0.1 mm or more were generated around the chip capacitors.
B: Solder balls with a diameter of 0.1 mm or more were generated around the chip capacitors.

A flux evaluated as A was considered to be acceptable, and a flux evaluated as B was considered to be unacceptable.
<<Evaluation of Tacking>>
Evaluation Method:

The adhesive strength of a flux after storage was evaluated by the evaluation method described in 4.5 of JIS Z 3284-3 (2014). A tackiness tester TK-1 (manufactured by Malcom Co., Ltd.) was used as a measuring device.

The solder paste of each example was printed on an alumina plate using a metal mask to produce four printed patterns each having a diameter of 6.5 mm and a thickness of 0.2 mm. Next, the alumina plate printed with the solder paste was placed in a sealed container and left still for eight hours at 25° C. and 50% humidity in a constant temperature and humidity room. The printed pattern was then placed under a probe of the tackiness tester, and the center of the pattern was aligned with the center of the probe. Next, the probe was lowered into the paste at a speed of 2.0 mm/s and pressurized with a constant pressure of 0.05±0.005 N. Then, the probe was pulled up at a speed of 10 mm/s within 0.2 seconds after pressurization. The four printed patterns were measured in terms of force required to be separated from the probe, and the maximum force was taken as the adhesive strength. In the table, the unit of adhesive force is [N].
<<Evaluation of Mountability of Parts>>
Evaluation Method:

A pattern having a diameter of 1.6 mm and a thickness of 0.12 mm was printed with the prepared solder paste on a printed circuit board having a land pattern for mounting chip parts using a metal mask. Next, the printed circuit board printed with the solder paste was placed in a sealed container and left still for eight hours at 25° C. and 50% humidity in a constant temperature and humidity room. Next, 30 of 3216 chip capacitors were mounted using a mounter (NPM-W2, manufactured by Panasonic Corporation) on the printed circuit board after printing.
Evaluation Criteria:
A: No capacitors were misaligned against the board or fell off the board.
B: At least one capacitor was misaligned against the board or fell off the board.

TABLE 1

| Component | | Raw materials | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Solvent | First solvent | Isobornyl cyclohexanol | 60 | 60 | 60 | 60 | 60 | 60 | 60 | 60 |
| | | Trimethylolpropane | | | | | | | | |
| | Second solvent | Diethylene glycol monohexyl ether | 20 | | | | | | | |
| | Other solvents | Ethylene glycol monophenyl ether | | 20 | | | | | | |
| | | Propylene glycol monophenyl ether | | | 20 | | | | | |
| | | Diethylene glycol mono 2-ethylhexyl ether | | | | 20 | | | | |
| | | Tripropylene glycol n-butyl ether | | | | | 20 | | | |
| | | Diethylene glycol monobutyl ether | | | | | | 20 | | |
| | | Isostearyl alcohol | | | | | | | 20 | |
| | | 2-Methylpentane-2,4-diol | 10 | 10 | 10 | 10 | 10 | 10 | 10 | 30 |
| | | α-Terpineol | | | | | | | | |
| Thixotropic agent | Polyamide | Polyamide | 5 | 5 | 5 | 5 | 5 | 5 | 5 | 5 |
| | Other thixotropic agents | Stearic acid amide | | | | | | | | |
| | | N,N'-methylenebis(stearamide) | | | | | | | | |
| | | Hydrogenated castor oil | | | | | | | | |
| Active agent | Organic acids | Organic acid mixture | | | | | | | | |
| | | Diglycolic acid | 5 | 5 | 5 | 5 | 5 | 5 | 5 | 5 |
| | | | 100 | 100 | 100 | 100 | 100 | 100 | 100 | 100 |
| | | Second solvent/First solvent (mass ratio) | 0.33 | 0.00 | 0.00 | 0.00 | 0.00 | 0.00 | 0.00 | 0.00 |
| | | Polyamide/Second solvent (mass ratio) | 0.25 | | | | | | | |
| | | Evaluation of amount of flux residue | A | A | A | A | A | A | A | A |
| | | Evaluation of heating sagging-suppressibility | 0.2 | 0.2 | 0.2 | 0.2 | 0.2 | 0.2 | 0.2 | 0.2 |
| | | Evaluation of solder ball generation-suppressibility | A | A | A | A | A | A | A | A |
| | | Evaluation of tacking | 0.4 | 0.1 | 0.1 | 0.1 | 0.1 | 0.1 | 0.1 | 0.1 |
| | | Evaluation of mountability of parts | A | B | B | B | B | B | B | B |

(Ex.: Example)

TABLE 2

| Component | | Raw materials | Ex. 9 | Ex. 10 | Ex. 11 | Ex. 12 | Ex. 13 | Ex. 14 | Ex. 15 |
|---|---|---|---|---|---|---|---|---|---|
| Solvent | First solvent | Isobornyl cyclohexanol | 60 | 60 | 53 | 53 | 53 | 74 | 76 |
| | | Trimethylolpropane | | | | | | | |
| | Second solvent | Diethylene glycol monohexyl ether | 22 | 24 | 20 | | | 19 | 19 |
| | Other solvents | Ethylene glycol monophenyl ether | | | | | | | |
| | | Propylene glycol monophenyl ether | | | | | | | |
| | | Diethylene glycol mono 2-ethylhexyl ether | | | | | | | |
| | | Tripropylene glycol n-butyl ether | | | | | | | |
| | | Diethylene glycol monobutyl ether | | | | | | | |
| | | Isostearyl alcohol | | | | 20 | | | |
| | | 2-Methylpentane-2,4-diol | 10 | 10 | 10 | 10 | 30 | | |
| | | α-Terpineol | | | | 10 | 10 | 10 | |
| Thixotropic agent | Polyamide | Polyamide | 5 | 5 | 4 | 4 | 4 | 4 | 4 |
| | Other thixotropic agents | Stearic acid amide | | | | | | | |
| | | N,N'-methylenebis(stearamide) | | | | | | | |
| | | Hydrogenated castor oil | | | | | | | |
| Active agent | Organic acids | Organic acid mixture | | | | | | | |
| | | Diglycolic acid | 3 | 1 | 3 | 3 | 3 | 3 | 1 |
| | | | 100 | 100 | 100 | 100 | 100 | 100 | 100 |
| | | Second solvent/First solvent (mass ratio) | 0.37 | 0.40 | 0.38 | 0.00 | 0.00 | 0.26 | 0.25 |
| | | Polyamide/Second solvent (mass ratio) | 0.23 | 0.21 | 0.20 | | | 0.21 | 0.21 |
| | | Evaluation of amount of flux residue | A | A | A | A | A | A | A |
| | | Evaluation of heating sagging-suppressibility | 0.2 | 0.2 | 0.2 | 0.2 | 0.2 | 0.2 | 0.2 |
| | | Evaluation of solder ball generation-suppressibility | A | A | A | A | A | A | A |
| | | Evaluation of tacking | 0.4 | 0.4 | 0.3 | 0.1 | 0.1 | 0.6 | 0.6 |
| | | Evaluation of mountability of parts | A | A | A | B | B | A | A |

(Ex.: Example)

TABLE 3

| Component | | Raw materials | Ex. 16 | Ex. 17 | Ex. 18 | Ex. 19 | Ex. 20 | Ex. 21 | Ex. 22 | Ex. 23 |
|---|---|---|---|---|---|---|---|---|---|---|
| Solvent | First solvent | Isobornyl cyclohexanol | 86 | 75 | 50 | 30 | 40 | 73 | | 75 |
| | | Trimethylolpropane | | | | | | | 30 | |
| | Second solvent | Diethylene glycol monohexyl ether | 10 | 21 | 46 | 30 | 38 | 19 | 30 | 21 |
| | Other solvents | Ethylene glycol monophenyl ether | | | | | | | | |
| | | Propylene glycol monophenyl ether | | | | | | | | |
| | | Diethylene glycol mono 2-ethylhexyl ether | | | | | | | | |

TABLE 3-continued

| Component | | Raw materials | Ex. 16 | Ex. 17 | Ex. 18 | Ex. 19 | Ex. 20 | Ex. 21 | Ex. 22 | Ex. 23 |
|---|---|---|---|---|---|---|---|---|---|---|
| | | Tripropylene glycol n-butyl ether | | | | | | | | |
| | | Diethylene glycol monobutyl ether | | | | | | | | |
| | | Isostearyl alcohol | | | | | | | | |
| | | 2-Methylpentane-2,4-diol | | | | | 28 | 10 | | 28 |
| | | α-Terpineol | | | | | | | | |
| Thixotropic agent | Polyamide | Polyamide | 4 | 4 | 4 | 7 | 7 | 4 | 7 | 4 |
| | Other thixotropic agents | Stearic acid amide | | | | | | | | |
| | | N,N'-methylenebis(stearamide) | | | | | | | | |
| | | Hydrogenated castor oil | | | | | | | | |
| Active agent | Organic acids | Organic acid mixture | | | | | | 1 | | |
| | | Diglycolic acid | | | | 5 | 5 | 3 | 5 | |
| | | | 100 | 100 | 100 | 100 | 100 | 100 | 100 | 100 |
| Second solvent/First solvent (mass ratio) | | | 0.12 | 0.28 | 0.92 | 1.00 | 0.95 | 0.26 | 1.00 | 0.28 |
| Polyamide/Second solvent (mass ratio) | | | 0.40 | 0.19 | 0.09 | 0.23 | 0.18 | 0.21 | 0.23 | 0.19 |
| Evaluation of amount of flux residue | | | A | A | A | A | A | A | A | A |
| Evaluation of heating sagging-suppressibility | | | 0.2 | 0.2 | 0.4 | 0.3 | 0.3 | 0.2 | 0.4 | 0.2 |
| Evaluation of solder ball generation-suppressibility | | | A | A | A | A | A | A | A | A |
| Evaluation of tacking | | | 0.6 | 0.6 | 0.6 | 0.4 | 0.5 | 0.6 | 0.4 | 0.6 |
| Evaluation of mountability of parts | | | A | A | A | A | A | A | A | A |

(Ex.: Example)

TABLE 4

| Component | | Raw materials | C. Ex. 1 | C. Ex. 2 | C. Ex. 3 | C. Ex. 4 |
|---|---|---|---|---|---|---|
| Solvent | First solvent | Isobornyl cyclohexanol | 80 | 60 | 60 | 60 |
| | | Trimethylolpropane | | | | |
| | Second solvent | Diethylene glycol monohexyl ether | 15 | 28 | 20 | 20 |
| | Other solvents | Ethylene glycol monophenyl ether | | | | |
| | | Propylene glycol monophenyl ether | | | | |
| | | Diethylene glycol mono 2-ethylhexyl ether | | | | |
| | | Tripropylene glycol n-butyl ether | | | | |
| | | Diethylene glycol monobutyl ether | | | | |
| | | Isostearyl alcohol | | | | |
| | | 2-Methylpentane-2,4-diol | | 10 | 10 | 10 |
| | | α-Terpineol | | | | |
| Thixotropic agent | Polyamide | Polyamide | | 2 | | |
| | Other thixotropic agents | Stearic acid amide | | | 5 | |
| | | N,N'-methylenebis(stearamide) | | | | 5 |
| | | Hydrogenated castor oil | 5 | | | |
| Active agent | Organic acids | Organic acid mixture | | | | |
| | | Diglycolic acid | | | 5 | 5 |
| | | | 100 | 100 | 100 | 100 |
| Second solvent/First solvent (mass ratio) | | | 0.19 | 0.47 | 0.33 | 0.33 |
| Polyamide/Second solvent (mass ratio) | | | 0.00 | 0.07 | 0.00 | 0.00 |
| Evaluation of amount of flux residue | | | A | A | A | A |
| Evaluation of heating sagging-suppressibility | | | 0.8 | 0.5 | 0.7 | 0.8 |
| Evaluation of solder ball generation-suppressibility | | | B | B | B | B |
| Evaluation of tacking | | | 0.6 | 0.4 | 0.4 | 0.4 |
| Evaluation of mountability of parts | | | A | A | A | A |

(C. Ex.: Comparative Example)

The fluxes of Example 1 to 23, each containing the first solvent, were evaluated as A in terms of the amount of flux residue.

The fluxes of Example 1 to 23, each containing the polyamide, were evaluated as less than 0.5 mm in terms of heating sagging-suppressibility, and evaluated as A in terms of solder ball generation-suppressibility.

The fluxes of Comparative Examples 1, 3 and 4, free from any polyamides, were evaluated as 0.6 mm or more in terms of heating sagging-suppressibility, and evaluated as B in terms of solder ball generation-suppressibility.

The flux of Comparative Example 2, in which the amount of polyamide was 2% by mass, was evaluated as 0.5 mm in terms of heating sagging-suppressibility, and evaluated as B in terms of solder ball generation-suppressibility.

The flux of Example 18, in which the mass ratio of polyamide/second solvent was less than 0.15, was evaluated as 0.4 mm in terms of heating sagging-suppressibility.

The fluxes of Examples 16 and 17, in which the mass ratio of polyamide/second solvent was 0.15 to 0.40, were evaluated as 0.2 mm in terms of heating sagging-suppressibility.

Namely, it was confirmed that the heating sagging-suppressibility was easily improved by making the mass ratio of polyamide/second solvent be 0.15 to 0.40.

The flux of Example 19, containing isobornyl hexanol, was evaluated as 0.3 mm in terms of heating sagging-suppressibility.

The flux of Example 22, containing trimethylolpropane, was evaluated as 0.4 mm in terms of heating sagging-suppressibility.

Namely, it was confirmed that the flux containing isobornyl hexanol as the first solvent easily further improved heating sagging-suppressibility.

The fluxes of Examples 1, 9 to 11 and 14 to 23 and Comparative Examples 1 to 4, each containing the second solvent, evaluated as 0.3 N or more in terms of tacking, and evaluated as A in terms of mountability of parts.

The fluxes of Examples 2 to 8, 12 and 13, free from any second solvents, evaluated as 0.1 N in terms of tacking, and evaluated as B in terms of mountability of parts.

Namely, it was confirmed that the presence of both the first solvent and the second solvent further enhanced the tacking of the flux and further improved the mountability of parts.

The fluxes of Examples 14 to 18, 21 and 23, in which a solvent composed of the first solvent and the second solvent was contained, were evaluated as 0.6 N in terms of tacking.

Namely, it was confirmed that the tacking was easily further improved by making the mass ratio of second solvent/first solvent be 0.1 to 1.0.

INDUSTRIAL APPLICABILITY

The present invention makes it possible to provide a flux which can reduce flux residue and suppress heating sagging, and a solder paste. The flux is favorably used to carry out soldering without washing flux residue.

The invention claimed is:

1. A flux comprising: at least one selected from the group consisting of isobornyl cyclohexanol and trimethylolpropane; a compound of general formula (1), the compound having a boiling point of 250° C. or more and a relative permittivity of 6.0 or more; and a thixotropic agent, wherein
   resin components are not comprised,
   the thixotropic agent comprises a polyamide which is condensate of an aliphatic carboxylic acid, a hydroxy group-containing aliphatic carboxylic acid and an amine,
   an amount of the at least one selected from the group consisting of isobornyl cyclohexanol and trimethylolpropane relative to a total mass, 100% by mass, of the flux is 30% by mass or more, and
   an amount of the polyamide relative to the total mass of the flux, 100% by mass, exceeds 2% by mass,

in the formula, $R^1$ is a hydrocarbon group having two to four carbon atoms, $R^2$ is a hydrocarbon group having four to ten carbon atoms, and m is 1 to 3.

2. The flux according to claim 1, wherein a mass ratio of a second solvent which is the compound of general formula (1), the compound having a boiling point of 250° C. or more and a relative permittivity of 6.0 or more, to a first solvent which is the at least one selected from the group consisting of isobornyl cyclohexanol and trimethylolpropane, indicated as the mass ratio of second solvent/first solvent, is 0.1 to 1.0.

3. The flux according to claim 1, wherein a mass ratio of the polyamide to a second solvent which is the compound of general formula (1), the compound having a boiling point of 250° C. or more and a relative permittivity of 6.0 or more, indicated as the mass ratio of polyamide/second solvent, is 0.15 to 0.4.

4. The flux according to claim 1, wherein the aliphatic carboxylic acid comprise a dicarboxylic acid.

5. A solder paste comprising a solder alloy powder and a flux of claim 1.

6. A method for producing a bonded body, comprising a step in which a part and a substrate are soldered to obtain a bonded body, wherein
   reflow is carried out using a solder paste of claim 5 under reducible gas atmosphere during soldering.

* * * * *